United States Patent
Sakamoto

(12) 
(10) Patent No.: US 6,314,764 B1
(45) Date of Patent: Nov. 13, 2001

(54) METHOD OF MANUFACTURING A 1-INCH DIAMETER GLASS SUBSTRATE FOR A MAGNETIC DISK

(75) Inventor: Yasuaki Sakamoto, Kameoka (JP)

(73) Assignee: Saatec Engineering Corporation, Kyoto (JP)

( * ) Notice: Subject to any disclaimer, the term of this patent is extended or adjusted under 35 U.S.C. 154(b) by 0 days.

(21) Appl. No.: 09/784,166

(22) Filed: Feb. 16, 2001

(51) Int. Cl.$^7$ .................................................... C03B 40/00
(52) U.S. Cl. .................. 65/374.12; 65/374.1; 65/374.11; 65/371.13; 65/374.15; 65/26; 427/135; 427/528; 427/531; 427/534; 427/530; 427/576; 427/577; 204/192.15; 204/192.16; 148/239; 148/278; 148/900; 148/DIG. 83
(58) Field of Search .............................. 65/374.1, 374.11, 65/374.12, 374.13, 374.15, 26; 427/135, 528, 531, 534, 530, 576, 577; 204/192.15, 192.16; 148/239, 278, 900, DIG. 83

(56) References Cited

U.S. PATENT DOCUMENTS

| | | | | |
|---|---|---|---|---|
| 4,793,792 | * | 12/1988 | Akino | 425/385 |
| 4,969,944 | * | 11/1990 | Marechal et al. | 65/104 |
| 5,427,599 | * | 6/1995 | Greschner et al. | 425/385 |
| 5,756,130 | * | 5/1998 | Umebayashi et al. | 425/385 |
| 5,902,369 | * | 5/1999 | Sakamoto | 65/374.15 |
| 6,136,385 | * | 10/2000 | Sakamoto | 427/530 |
| 6,151,917 | * | 11/2000 | Hibino et al. | 65/374.11 |

\* cited by examiner

*Primary Examiner*—Michael Colaianni
(74) *Attorney, Agent, or Firm*—Crowell & Moring LLP

(57) ABSTRACT

A method of manufacturing a 1-inch diameter glass substrate for a magnetic disc in which a plate glass is press molded using a mold formed of a super-hard material and having a surface of a prescribed roughness. Ion implantation using nitrogen ions is performed on the surface of the mold, after which ion implantation using palladium ions, platinum ions, and carbon ions is performed in the order given. Finally, the surface of the mold is coated with a graphite or amorphous diamond-like carbon coating.

6 Claims, No Drawings

METHOD OF MANUFACTURING A 1-INCH DIAMETER GLASS SUBSTRATE FOR A MAGNETIC DISK

BACKGROUND OF THE INVENTION

1. Field of the Invention

The present invention relates to a method of manufacturing a 1-inch diameter glass substrate for a magnetic disc by pressing a disk-shaped plate glass, and particularly to a method of manufacturing such a glass substrate for use in computers to store such digital data as audio and video data and graphics data, as well as in mobile equipment such as cellular telephones.

2. Description of the Related Art

Conventionally, polycarbonate, acrylic, epoxy, olefin, and other resinous materials have been used as the base material for magnetic disc and the like. However, these materials can be affected by high temperature, humidity, and other environmental conditions and can deteriorate over time. Discs composed of these materials are also restricted in storage capacity. Accordingly, glass, which is not affected by high temperatures, has been incorporated as a base material for magnetic discs and the like.

A glass substrate is formed from a plate glass molded through a fusion or float method. After being inspected, the plate glass is cut into a prescribed disc-shape and annealed at a temperature of 300–500° C. After the annealing process, a peripheral process and polishing process are performed to provide a flat finish on the surfaces and edges of the disc.

Recently, a method already used in such optical systems as the manufacturing of lenses with small apertures has been employed in the manufacturing of glass substrates for magnetic discs. This method uses a metal mold having a precisely formed surface to press mold glass that has been performed through cutting, annealing, and other processes in order to obtain a product having a prescribed flatness. Here, the metallic mold is formed of a super-hard material that is coated with a graphite or amorphous diamond-like carbon coating to achieve a precise smoothness. The carbon coating is applied to the surface to cover cavities formed therein. Without coating the surface of the mold, these cavities will transfer flaws to the surface of the molded glass.

However, in the conventional method of manufacturing a glass substrate for a magnetic disk, a lapping process is required to adjust the thickness and outer edge of the press molded product. Much time and effort is required to perform this polishing process. After the polishing process, the molded glass substrate is washed with an organic neutralizer and pure water. Accordingly, such a process requires expensive equipment to supply the neutralizer and pure water and to perform a post-process on the resulting wastewater. After about ten thousand continuous shots, the carbon coating begins to peel from the surface of the mold used to form the glass substrate.

Therefore, the inventors of the present invention performed ion implantation in the surface of the mold member formed of a super-hard material and having a prescribed smoothness in order to improve the material's resistance to friction, abrasion, and fatigue. This ion implantation also improved the adhesiveness of the carbon coating on the surface of the metallic mold member, greatly improving the life of the mold. By using such a mold, it is possible to press mold a plate glass to obtain a molded product with few errors in diameter and thickness. This mold also enables the manufacturing of 1-inch diameter glass substrates for magnetic discs, while rendering the lapping process unnecessary and reducing the overall time of the manufacturing process.

SUMMARY OF THE INVENTION

In view of the foregoing, it is an object of the present invention to provide a method of manufacturing a 1-inch diameter glass substrate for a magnetic disc capable of producing glass substrates having a smooth finish, without the need of a lapping process or the expensive equipment required for such a process.

This object and others will be attained by a method of manufacturing a 1-inch diameter glass substrate for a magnetic disc, comprising the steps of performing nitrogen ion implantation in the surface of a mold formed of a super-hard material and having a prescribed flatness;

performing ion implantation with palladium ions, platinum ions, and carbon ions in the order given;

forming a graphite or an amorphous diamond-like carbon coating on the surface of the mold; and pressing a disk-shaped plate glass with the mold, the plate glass having a prescribed weight and a diameter smaller than the inner diameter of the mold, to form a 1-inch diameter glass substrate having a prescribed thickness.

According to another aspect of the present invention, the flatness of the mold surface is from 2/1000 to 8/1000, and the roughness average Ra of the mold is 5 $\mu$m or less. Further, ion implantation is performed in the surface of the mold up to a depth of at least 0.5 $\mu$m, and the thickness of the carbon coating formed on the mold surface after ion implantation is 0.1–1.0 $\mu$m.

According to another aspect of the present invention, a method of manufacturing a 1-inch diameter glass substrate for a magnetic disc, comprises the steps of performing nitrogen ion implantation in the surface of a mold formed of a super-hard material and having a prescribed flatness;

performing ion implantation with palladium ions, platinum ions, and carbon ions in the order given;

forming a graphite or amorphous diamond-like carbon coating on the surface of the mold; and pressing a disk-shaped plate glass with the mold, the plate glass having a diameter smaller than the inner diameter of the mold, to form a glass substrate of a prescribed thickness.

DESCRIPTION OF THE PREFERRED EMBODIMENTS

A method of manufacturing a 1-inch diameter glass substrate for a magnetic disc according to a preferred embodiment of the present invention will be described.

The mold used in the method of the present invention is formed of a super-hard material. The inner diameter of the mold surface is 1 inch. The surface of the mold is smoothed to have a flatness of from 2/1000 to 8/1000 and a surface roughness Ra of 5 $\mu$m or less. Further, ion implantation is performed on the mold to improve the adhesiveness of the carbon coating and to extend the life of the mold.

Ions used in the implantation process include nitrogen ions, palladium ions, platinum ions, and carbon ions for improving the adhesiveness of the carbon coating. However, in order to further improve the carbon coating adhesiveness, it is desirable to first perform ion implantation using nitrogen ions in the surface of the mold, and subsequently add impurities to the surface layer of the mold by performing ion implantation of palladium ions, platinum ions, and carbon ions in that order. The above ion implantation process is performed to a depth of at least 0.5 μm in the surface of the mold under the following conditions:

a high frequency discharge of 105–107 Hz,
an ion current of 10 ma,
an energy of 100–200 keV,
an ion irradiation amount of $1 \times 10^{15}$–$1 \times 10^{17}$ ions/cm$^2$,
a temperature of 300–700° C., and
an irradiation time of from 10 minutes to 8 hours.

Finally, a graphite or an amorphous diamond-like carbon coating is formed on the surface of the mold over the ion implanted layer at a thickness of 0.1–1.0 μm, thereby completing a mold for use in the method of the present invention.

The plate glass used in the method of the present invention is cut into a disc shape prior to the press molding process. At this time, the radius of the glass should be smaller than the radius of the mold. However, the diameter of the cut glass will differ according to the thickness of the plate glass and the desired thickness of the glass substrate to be manufactured.

Since the glass used in the method of the present invention is plate-shaped, it is possible to minimize variations or errors in the amount of glass that is cut. That is, errors in the thickness and diameter of the glass substrate are minimized when glass is forced into such areas during the press molding process described below, thereby eliminating the need for the lapping process following the molding process.

With the configuration described above, a process for manufacturing a 1-inch substrate for a magnetic disc begins by cutting a plate glass into a disc shape having a prescribed diameter using a cutter (not shown). The cut plate glass is preheated to the softening point of the glass material (generally about 600–700° C., but varying according to the type of glass). Subsequently, the glass is pressed in the mold, which has also been heated to the softening point of the glass. The mold is applied at a pressure of 500–2000 kg/cm$^2$ and held for a time of about 20 seconds. After the pressing process, the glass substrate is gradually cooled to 500–380° C. over a period of 15–20 minutes. Subsequently, the glass substrate is returned to room temperature, thereby completing the process of manufacturing a 1-inch diameter glass substrate for a magnetic disc.

In other words, the glass substrate is formed by pressing a circular plate glass according to the method described above to form a 1-inch diameter glass substrate of a prescribed thickness. Since the circular plate glass of a prescribed amount is molded in a 1-inch diameter mold having a good flatness and good releasing properties, the molded product has little error in dimensions. Therefore, this method can eliminate the lapping process conventionally performed after the molding process. Subsequently, the glass substrate undergoes such conventional processes as center hole punching, specular finish polishing, and chemical strengthening to be prepared for use as a magnetic disc.

Next, a more specific description of manufacturing a 1-inch diameter glass substrate using the above mold will be described. First a plate glass having a thickness of 3 millimeters is cut into a circular plate shape having a diameter of 25 millimeters and a weight of 3 grams. The cut plate glass is preheated to the softening point of the glass material, a temperature of 600–700° C. The plate glass is loaded into the mold, which has also been preheated to the same temperature, and press molded at a pressure of between 500 kg/cm$^2$ to 2 tons/cm$^2$.

After the molding process, the glass is gradually cooled to 500–380° C over an interval of 15–20 minutes. Subsequently, the glass is returned to room temperature to complete the process. The product meets all requirements for thickness, diameter, surface roughness, and flatness.

In the method of manufacturing a 1-inch diameter glass substrate for a magnetic disc according to the present invention described above, a plate glass is press molded using a mold formed of a super-hard material and having a surface of a prescribed roughness. Ion implantation using nitrogen ions is performed on the surface of the mold, after which impurities are added through the ion implantation of palladium ions, platinum ions, and carbon ions in the order given. Accordingly, the adhesiveness of the carbon coating on the mold material is improved, enabling the coating to withstand several tens of thousands of consecutive shots.

Further, the surface of the mold is provided with a high degree of smoothness and flatness. Glass substrates formed in this mold from plate glass cut to a prescribed diameter have a uniform thickness and diameter and have a flat, smooth surface. As a result, the lapping process conventionally employed after molding is no longer necessary.

What is claimed is:

1. A method of manufacturing a 1-inch diameter glass substrate for a magnetic disc, comprising the steps of:

performing nitrogen ion implantation in the surface of a mold formed of a super-hard material and having a prescribed flatness and an inner diameter;

performing ion implantation with palladium ions, platinum ions, and carbon ions in the order given;

forming a graphite or amorphous diamond-like carbon coating on the surface of the mold; and pressing a disk-shaped plate glass with the mold, the plate glass having a prescribed weight and a diameter smaller than the inner diameter of the mold, to form the 1-inch diameter glass substrate having a prescribed thickness.

2. A method of manufacturing a 1-inch diameter glass substrate for a magnetic disc as recited in claim 1, wherein the flatness of the mold surface is from 2/1000 to 8/1000.

3. A method of manufacturing a 1-inch diameter glass substrate for a magnetic disc as recited in claim 1, wherein the roughness average Ra of the mold is 5 μm or less.

4. A method of manufacturing a 1-inch diameter glass substrate for a magnetic disc as recited in claim 1, wherein ion implantation is performed in the surface of the mold up to a depth of at least 0.5 μm.

5. A method of manufacturing a 1-inch diameter glass substrate for a magnetic disc as recited in claim 1, wherein the thickness of the carbon coating formed on the mold surface after ion implantation is 0.1–1 μm.

6. A method of manufacturing a 1-inch diameter glass substrate for a magnetic disc, comprising the steps of:

performing nitrogen ion implantation in the surface of a mold formed of a super-hard material and having a prescribed flatness and an inner diameter.

performing ion implantation with palladium ions, platinum ions, and carbon ions in the order given;

forming a graphite or amorphous diamond-like carbon coating on the surface of the mold; and pressing a disk-shaped plate glass with the mold, the plate glass having a diameter smaller than the inner diameter of the mold, to form the 1-inch diameter glass substrate of a prescribed thickness.

* * * * *